(12) United States Patent
Rockwell

(10) Patent No.: US 7,075,308 B2
(45) Date of Patent: Jul. 11, 2006

(54) BLOCKING IMPEDANCE

(76) Inventor: Daniel J. Rockwell, 270 Valley Rd., Media, PA (US) 19063

( * ) Notice: Subject to any disclaimer, the term of this patent is extended or adjusted under 35 U.S.C. 154(b) by 5 days.

(21) Appl. No.: 10/799,441

(22) Filed: Mar. 12, 2004

(65) Prior Publication Data
US 2005/0057227 A1    Mar. 17, 2005

Related U.S. Application Data

(60) Provisional application No. 60/453,998, filed on Mar. 12, 2003.

(51) Int. Cl.
G01R 31/11 (2006.01)
G01R 13/04 (2006.01)

(52) U.S. Cl. .................. 324/534; 324/113
(58) Field of Classification Search ............... 324/534, 324/113
See application file for complete search history.

(56) References Cited

U.S. PATENT DOCUMENTS

| | | | |
|---|---|---|---|
| 3,702,460 A * | 11/1972 | Blose ................... | 340/3.1 |
| 3,913,038 A * | 10/1975 | Carter et al. ........... | 333/167 |
| 4,012,668 A * | 3/1977 | Wittlinger ............. | 361/44 |
| 5,369,366 A * | 11/1994 | Piesinger .............. | 324/533 |
| 5,729,144 A * | 3/1998 | Cummins .............. | 324/535 |
| 6,195,241 B1 * | 2/2001 | Brooks et al. ......... | 361/42 |
| 6,256,592 B1 * | 7/2001 | Roberts et al. ........ | 702/59 |
| 6,573,726 B1 * | 6/2003 | Roberts et al. ........ | 324/509 |
| 6,798,211 B1 * | 9/2004 | Rockwell et al. ...... | 324/527 |
| 2003/0085715 A1 * | 5/2003 | Lubkeman et al. ..... | 324/509 |

\* cited by examiner

Primary Examiner—Anjan Deb
(74) Attorney, Agent, or Firm—RatnerPrestia

(57) ABSTRACT

A power line distribution includes one or more impedance devices coupled to the neutral conductor of the power line distribution to segment the power line distribution for fault detection.

12 Claims, 10 Drawing Sheets

BLOCKING IMPEDANCE

CROSS REFERENCE TO RELATED APPLICATIONS

This application is related to and claims the benefit of U.S. Provisional Application No. 60/453,998 entitled BLOCKING IMPEDANCE filed on Mar. 12, 2003.

BACKGROUND

High-voltage underground power distribution circuits are configured in a number of different configurations. Often a single-phase underground distribution system is configured as a fused radial-circuit (see FIG. 1) or as a fused loop-circuit (see FIG. 2). The distribution circuit could also be configured in a more complex configuration consisting of branches (see FIG. 3). A branched circuit could take on any form.

A transient waveform is generated at the fault site on the initiation of a cable fault. This transient waveform or traveling wave, starts at the fault site and travels in both directions away from the fault. The traveling waves in either section of the circuit reflect between the fault location and a significant change of impedance in the circuit. This significant change of impedance can for example, result from the circuit open-points (end of circuit), the short-circuit caused by the fault, and by transitions from underground to overhead cables. The transition from underground to overhead presents an impedance that is sufficient to essentially block the fault signal, and therefore giving the appearance of a open-point.

A fault recorder, located at the open-point of the circuits illustrated in FIG. 1 and 2, would measure the traveling wave that reflects between the fault and open-point. This traveling wave reflects between the fault and open-point until its energy dissipates. If the circuits in FIGS. 1 and 2 are fed by overhead power lines, a fault recorder in the cable section between the fuse and fault, would record the traveling waves that reflect between the fault and transition point from underground to overhead.

When a circuit is branch as shown in FIG. 3, the fault signal will take different paths depending on the fault site and the branching locations. Should a fault occur on branch segment C, a fault recorder at the open end of branch segment C will record the traveling wave that reflects between the fault and open end of segment C. The fault in segment C, also generates a traveling wave that travels toward segment A. When this traveling wave reaches the intersection of segments A, B and C, the traveling wave splits and continues onto segments A and B. This split traveling wave reflects off the open end of segment B, and off a significant impedance change along segment A. The reflected wave from the open end of segment B splits at the intersection of segments A, B and C. This split traveling wave reflects off the fault in segment C, and off a significant change in impedance on segment A. Likewise, the traveling wave that reflects from the significant impedance change on segment A will split when it reaches the intersection of segments A, B and C, and continue onto segments B and C. The traveling wave created by the fault in segment C seen on segments A and B is therefore a combination of -multiple reflections off the fault and significant impedance changes in segments A and B. A fault recorder at the open end of segment B would therefore record a complex wave shape that consists of multiple reflections.

Should a fault occur in segment B of the branched circuit shown in FIG. 3, a fault recorder located at the open end of segment B would record the traveling wave that reflects between the fault and open end of segment B. Likewise, a fault recorder located at the open end of segment C would record a combination of reflections from the fault and significant changes in impedance on segments A and C. This process would be similar to that described in the previous paragraph.

The fault in segment C would create a simple traveling wave that reflects between the fault and open end of segment C. A fault recorder at the open end of segment C could effectively capture the traveling wave that is isolated between the fault and open end of segment C, and use the traveling wave to estimate the fault location. Similarly, a fault recorder at the end of segment B could effectively capture a simple traveling wave generated from a fault on segment B, and use the traveling wave to estimate the fault location. A complexity occurs when the fault is in section A.

A fault in section A would cause the fault recorders at the open ends of section B and C, to record complex waveforms resulting from multiple reflections. Since a branched circuit could take any form, multiple solutions for the fault location estimation would result. This limits the usefulness of a fault recorder and estimator for branched circuits.

SUMMARY OF THE INVENTION

The purpose of this invention is to effectively utilize a fault recorder to estimate fault location on a branched circuit or circuit lacking a significant change in impedance at a desirable location. When a circuit is branched or lacks a significant change in impedance, an impedance can be introduced into the circuit. The purpose of the added impedance is to control the path taken by the traveling waves used for fault location estimation. This added impedance is essentially a blocking impedance whose purpose is to present a sufficient impedance on non-faulted connected lines so as to effectively block a majority of the fault signals from entering non-faulted connected cable sections.

Further, this invention is embodied in a method of controlling the path taken by the traveling wave that results from a cable fault on a power distribution circuit. By controlling the path taken by the traveling wave, a more cost effective and deterministic means or fault estimation can be achieved. This method allows for a blocking impedance to be installed at any desired location within a circuit. The blocking impedance provides a reflection point for the traveling waves. Further, this allows a fault recorder to be installed at any desired location to record traveling waves over controllable cable sections.

DETAILED DESCRIPTION

Figure 1:
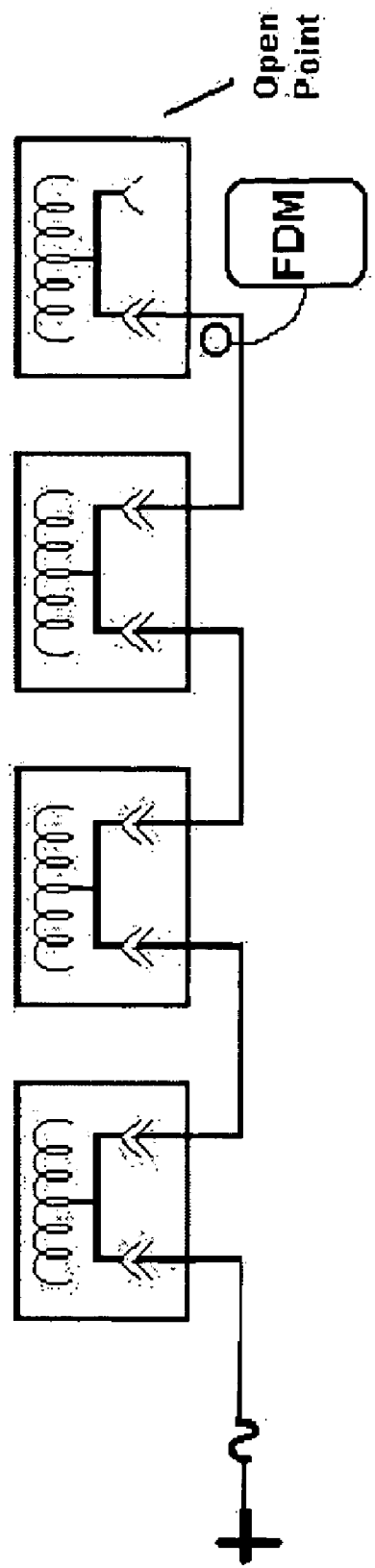
FIG. 1 (Prior Art) is a schematic diagram of a radial circuit for underground power distribution.
Figure 2:
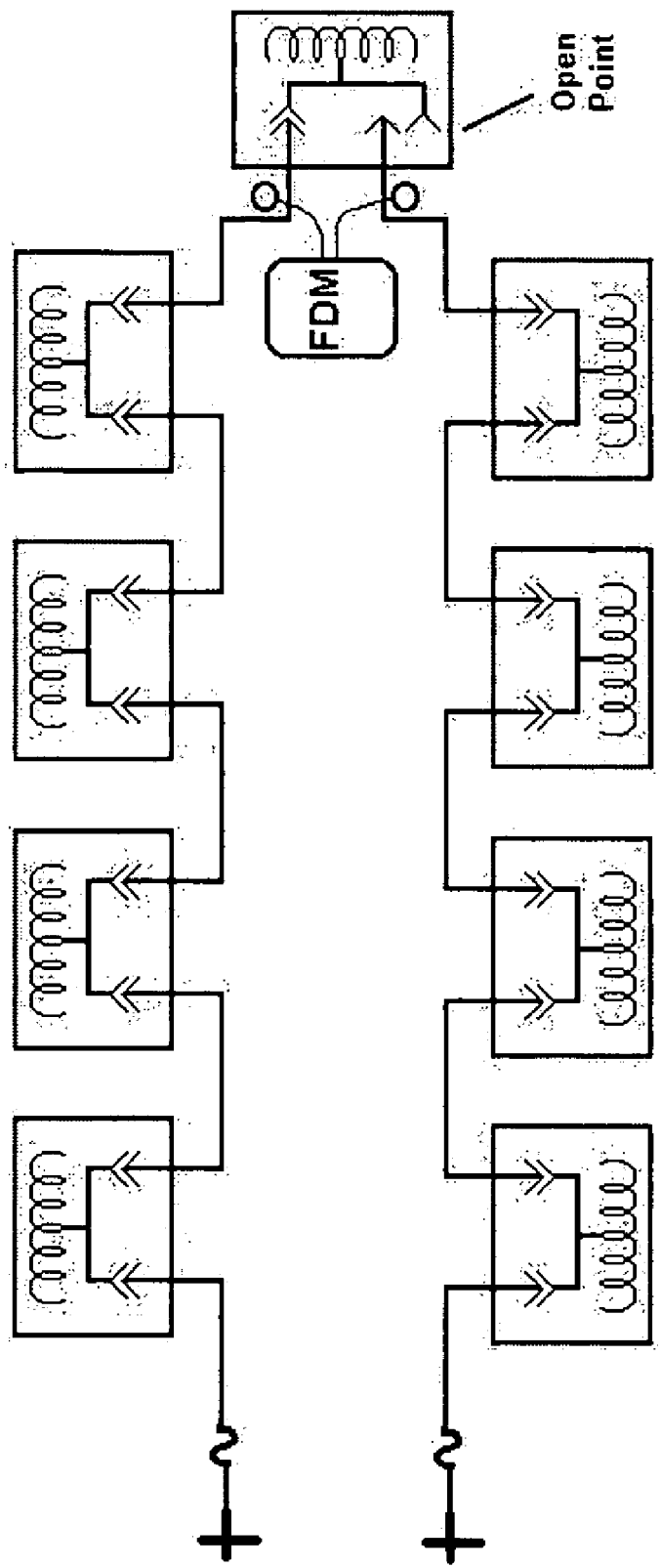
FIG. 2 (Prior Art) is a schematic diagram of a loop circuit for underground power distribution.
Figure 3:
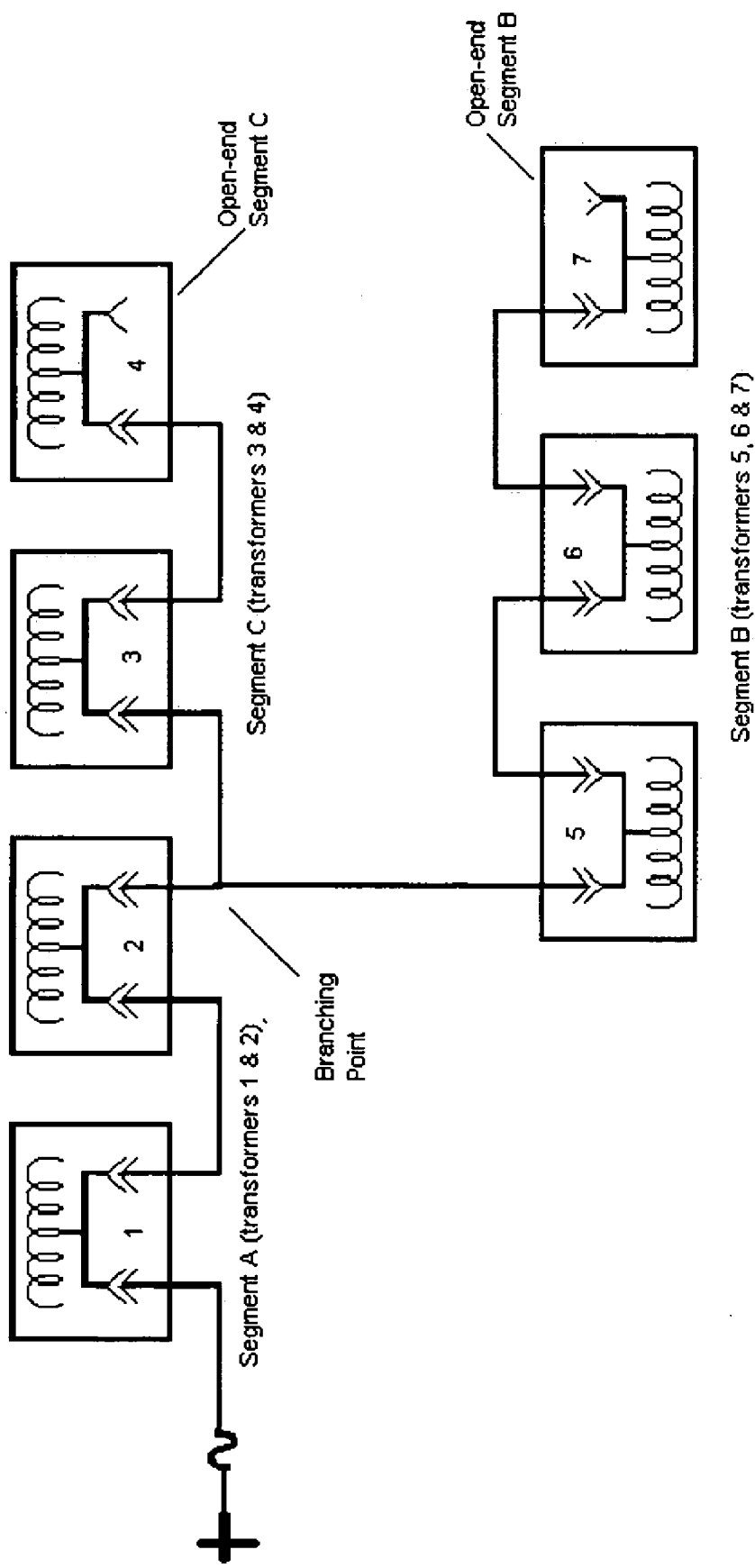
FIG. 3 (Prior Art) is a schematic diagram of a branch circuit for underground power distribution.

If the circuits of FIG. 1 and 2 are fed from underground rather than overhead, there is no reflection point for the traveling waves at the fuse or feed point. Significant impedance however can be readily introduced into the circuit at the feed point to create a point of reflection for the traveling waves. This impedance can be created using components such as a resistor, inductor or ferrite. The impedance should be sufficient to cause a majority of the traveling wave to reflect back toward the fault location.

The blocking impedance can be achieved using a resistor, inductor, ferrite or similar passive device in the neutral line at the desired location. A resistor is not a practical solution in terms of size and cost when designed for a power distribution system. An inductor could be used, but would need to be designed to handle normal circuit conditions as well as fault conditions. Under fault conditions the inductor would be subjected to currents many times higher than that of normal circuit operations. The cost of the resulting coil capable of operating under all circuit conditions would be quite significant. Although the coil could be relatively inexpensive, it would require significant testing, which would add to the cost. Further, it would require changes to grounding practices that could be objectionable to some electric utilities. A benefit of the coil is that it could be designed so that the impedance it presents remains essentially constant over the applied current range. Both the resistor and inductor would be installed in series with the neutral line. A ferrite would be installed around the neutral line, removing the need to open the line for installation. Since the ferrite is not installed in series with the neutral line and it does not carry current, and its design requirements are significantly reduced. Further, use of a ferrite would not affect grounding practices. Conversely, a ferrite saturates at high currents typical of those produced by cable faults. The ferrite implementation therefore has limitations that are overcome by using a coil. The resulting impedance provided by the coil and ferrite are frequency dependent. Therefore, the coil and ferrite are specifically designed to block traveling wave of specific bandwidths. pg,6

Figure 4:
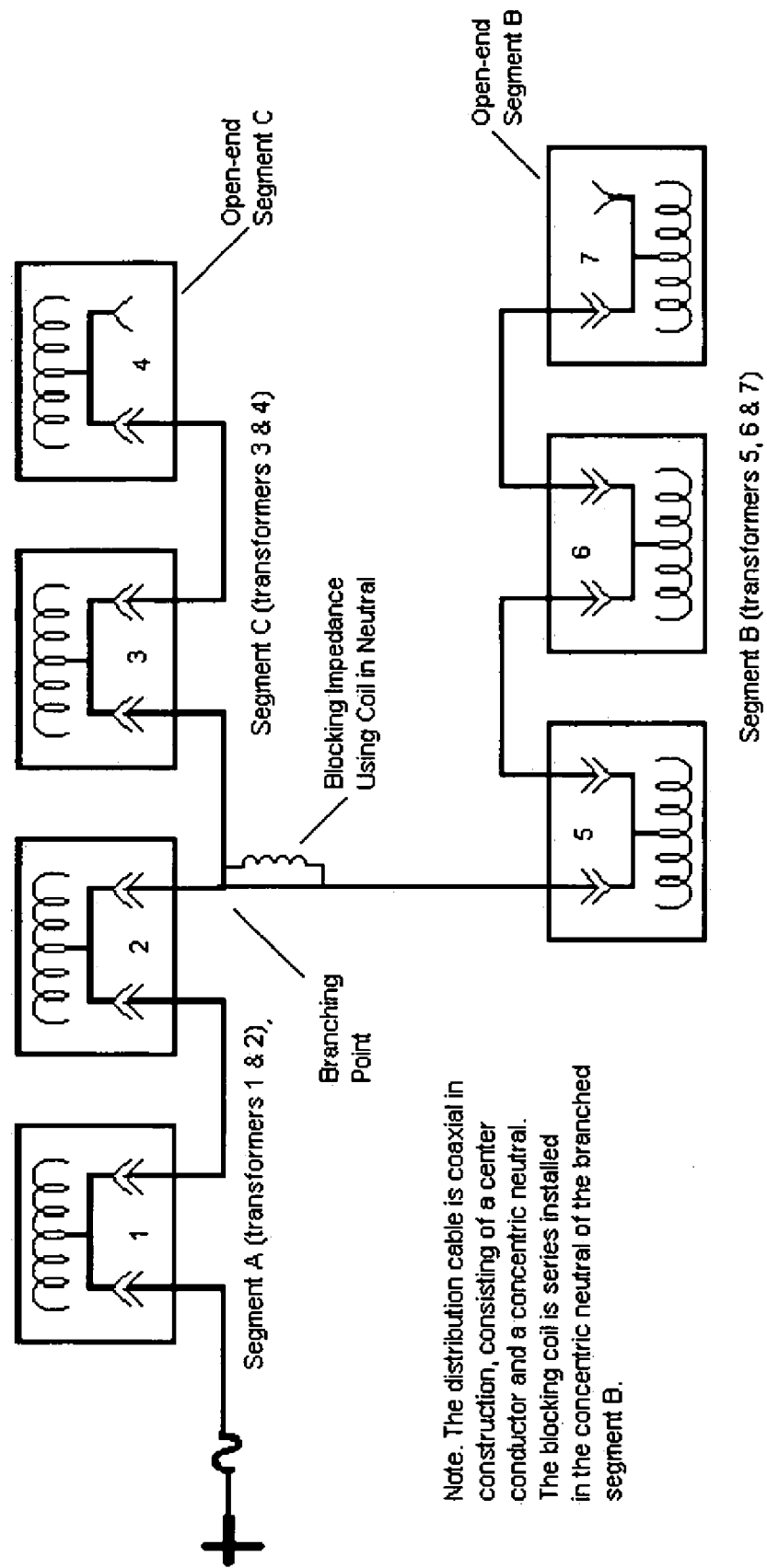
FIGS. 4 and 7 are schematic diagrams of a branch circuit that includes an embodiment of the present invention.

FIG. 4 illustrates a blocking impedance using a coil on the simple branched circuit. A coil is series connected in the neutral line of the branch segment B, at the intersection of segments A, B and C. With this configuration, the circuit appears to consist of two independent circuits, when viewed by fault recorders at the open ends of segments B and C. Segment B appears as a single circuit. A fault recorder at the open end of segment B would record the simple traveling wave caused by a fault on segment B, that reflects between the fault and open end. Similarly, a fault recorder at the open end of segment C would record the simple traveling wave caused by a fault on segment A or C. The blocking coil on segment B imposes an impedance to the traveling wave on segments A and C, thereby effectively isolating segment B. This prevents multiple reflections from connected non-faulted cable segments. When a fault recorder sees multiple reflections from connected segments, it becomes difficult to estimate the fault location. By effectively isolating cable segments using a blocking impedance, a very effective and deterministic means of fault location estimation can be applied to branched circuits.

Figure 5:
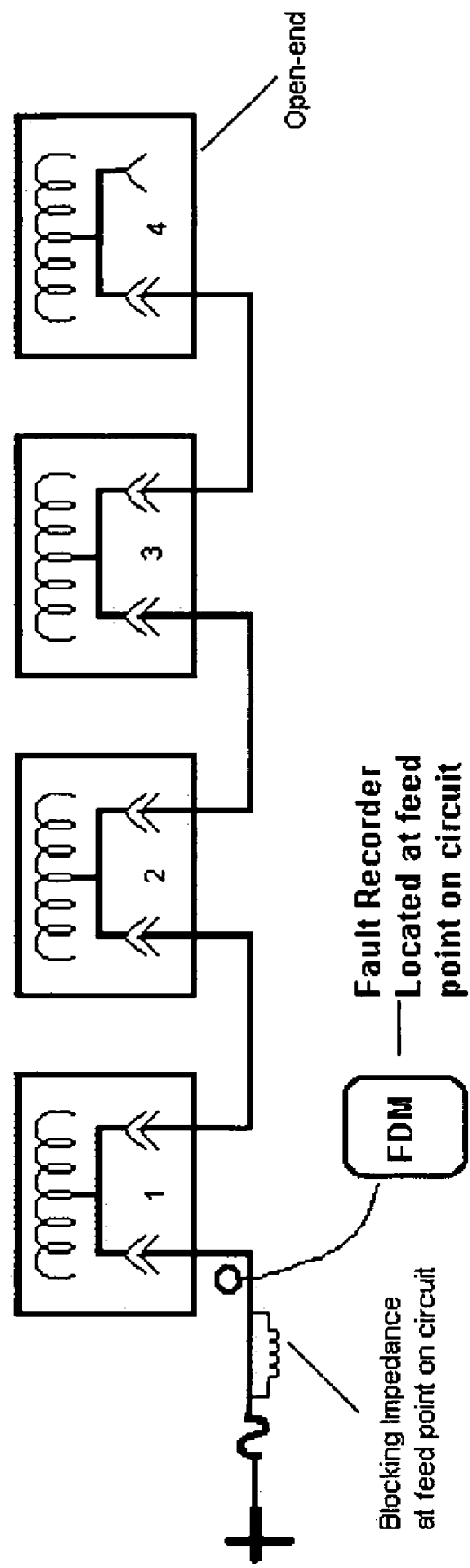
FIG. 5 is a schematic diagram of a radial circuit that includes an embodiment of the present invention.
Figure 6:
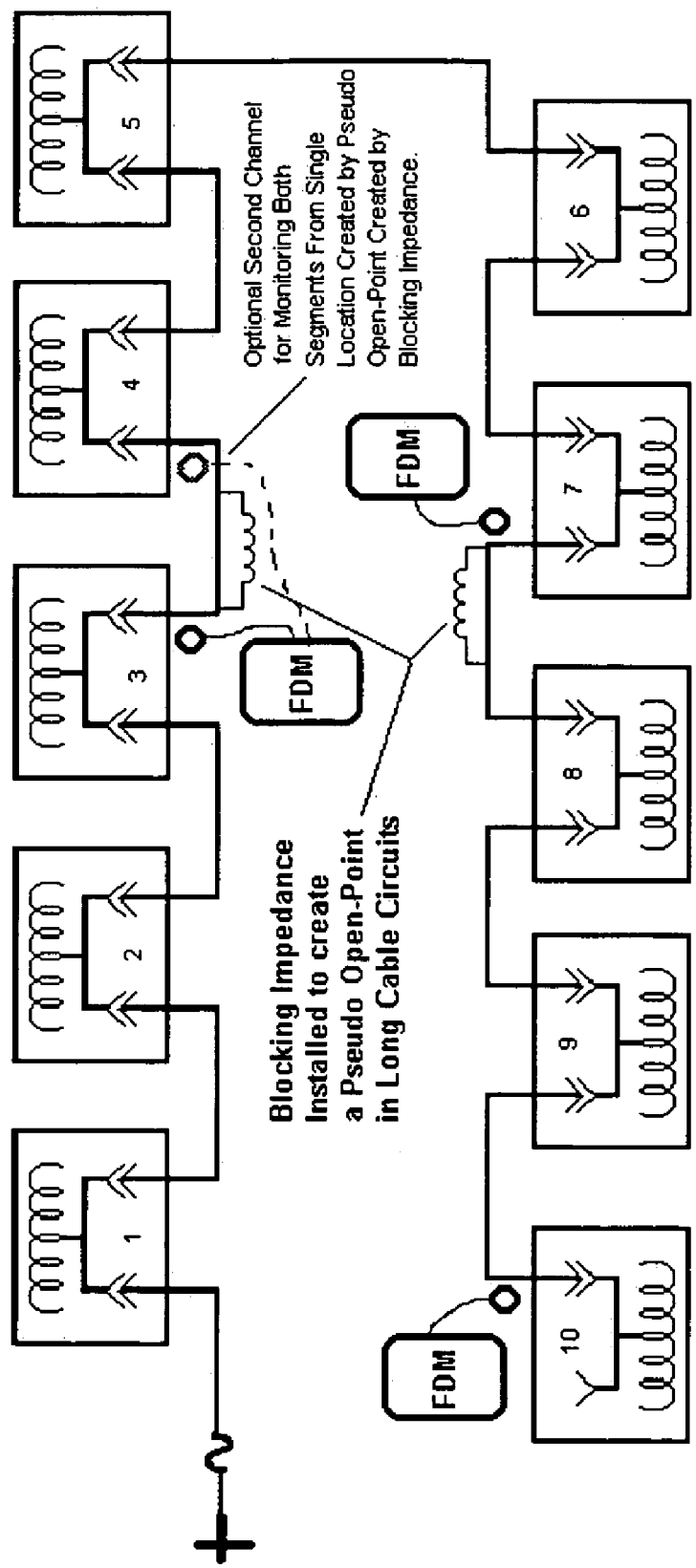
FIG. 6 is a schematic diagram of a loop circuit that includes an embodiment of the present invention.

Likewise, a blocking impedance using a coil could be installed at the fused or feed end of a circuit. This would effectively create a simulated open point for traveling wave reflections. This would be particularly useful in situations where it is desirable to locate a fault recorder at the fused or feed end of the circuit. This would create a reflection point where one many not otherwise exist. This method could also be used to segment an otherwise excessively long cable into more definable lengths to facilitate fault location estimation. There are limitations on the effective cable length that fault estimators can function. By effectively segmenting a cable using blocking impedances, one can extend the usefulness of a fault location estimator. FIG. 5 illustrates a blocking impedance installed at the feed or fused end of a cable circuit, and FIG. 6 illustrates a method for segmenting a long cable into measurable segments to facilitate fault location estimation. Note also in FIG. 6 that an optional two-channel fault recorder could monitor segments on either side of the pseudo open-point created by the installed blocking impedance.

Figure 7:
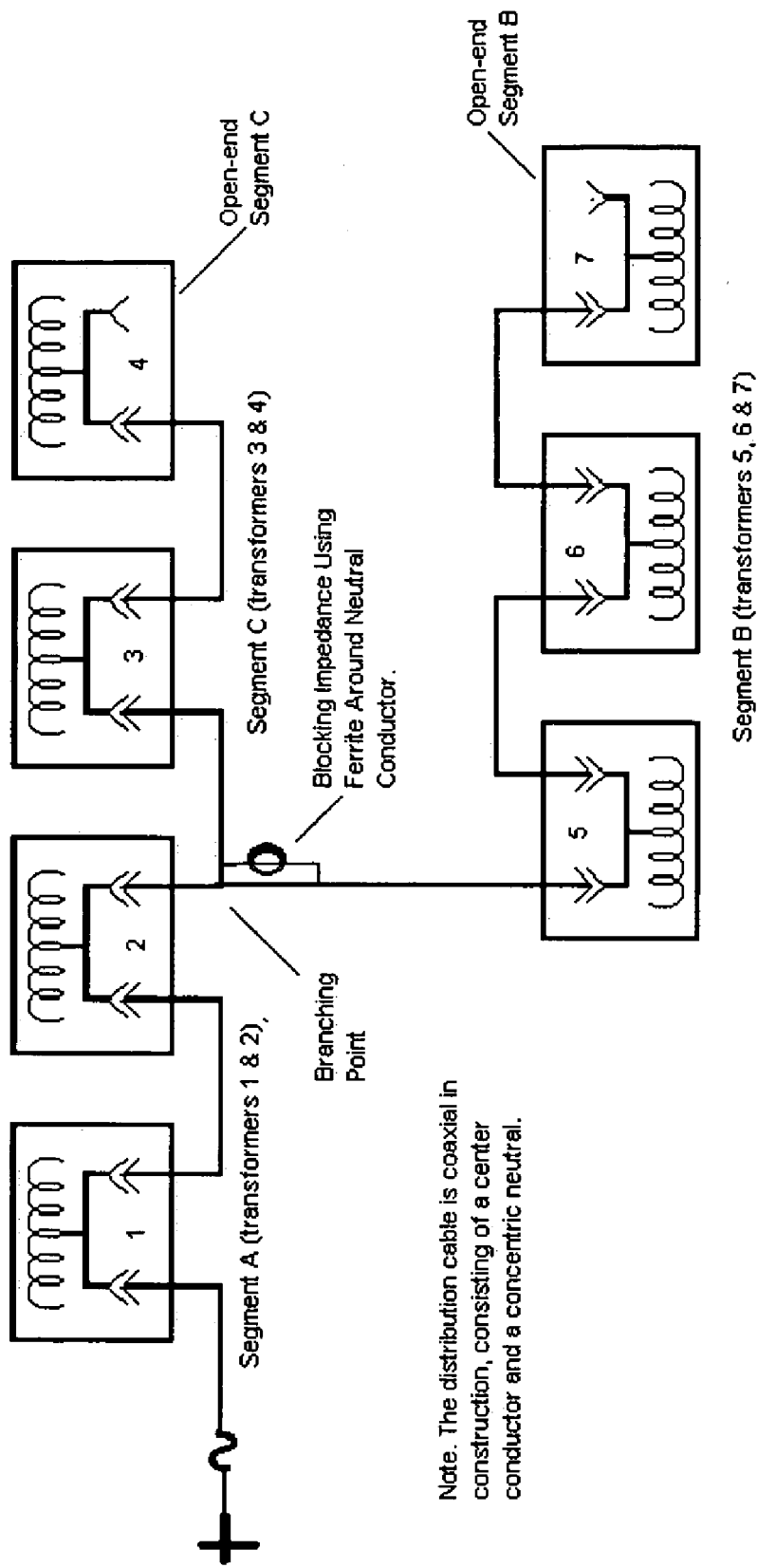

FIG. 7 illustrates a branched circuit with a ferrite blocking impedance installed on cable segment B, at the intersection of segments A, B and C. The ferrite creates an effective blocking impedance to traveling waves on cable segments A and C. Therefore, a fault recorder at the open end of segment C, would record a simple traveling wave that reflects from a fault on segments A or C and the open end of segment C. This blocking impedance blocks multiple reflections from connected non-fault branched cable sections, enabling an effective and deterministic method of fault location estimation on branched circuits. When a fault occurs on cable segment B, the ferrite blocking impedance will often saturate and lose its blocking impedance properties. If a fault recorder is located at the open end of segment B, a fault on segment B that causes the ferrite to saturate will not affect the traveling wave that reflects between the fault and open end of segment B.

It should be noted that the branched circuits illustrated on the included drawings consist of a single branch for simplicity and clarity of the explanation. A branched circuit can consist of many branches and take any form. A blocking impedance can be installed at any of the branch locations to control the path take by a traveling wave, and further provide a reliable means of fault location estimations. The fault recording and location estimating can be readily achieved using the Fault Distance Monitor (FDM) product commercially available by Remote Monitoring Systems, Inc. The use of a blocking impedance extends the useful of products like the Fault Distance Monitor.

Figure 8:
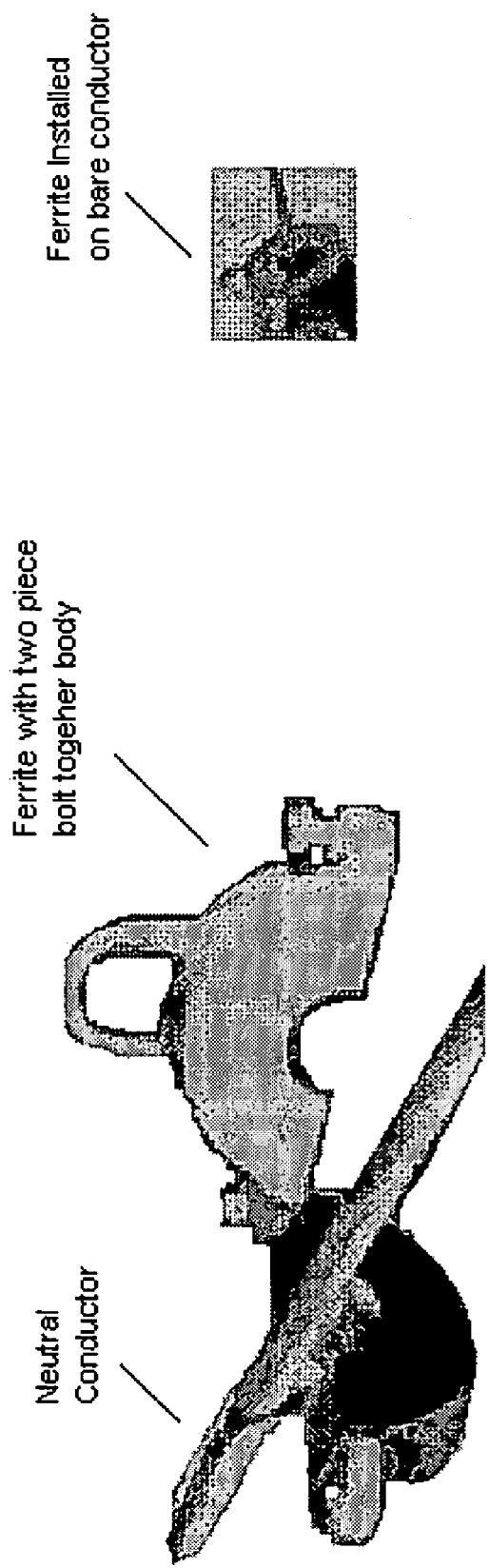
FIG. 8 is a perspective view of a ferrite impedance device.
Figure 9:
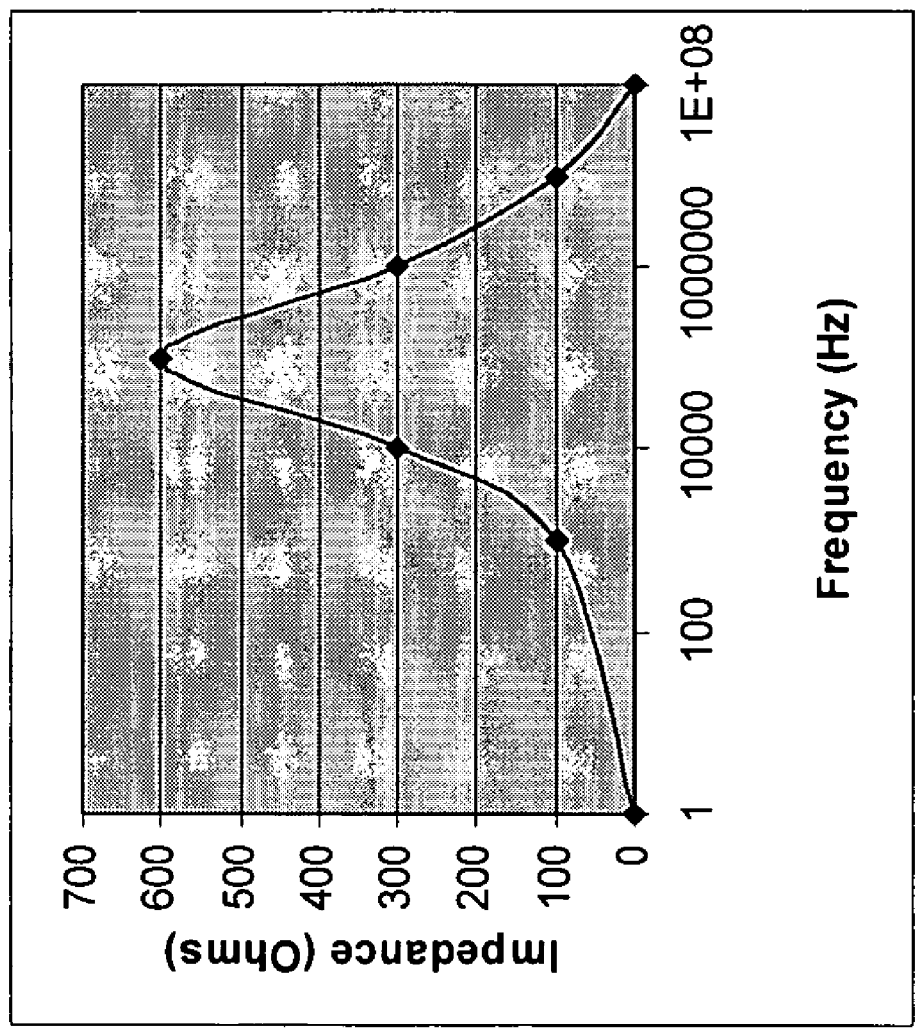
FIG. 9 is a graph of impedance versus frequency which is useful for describing the impedance devices used with the subject invention.

FIG. 8 illustrates a ferrite installation using a two-piece iron powder based ferrite blocking impedance typical of what would be used for the disclosed implementation. Both the inductor and ferrite blocking impedance desirably present an impedance to the traveling wave to significantly block a majority of the traveling wave. This use of a ferrite or inductor to filter or block high frequency signals on conductors is a well understood practice and not repeated here. The traveling wave to be blocking under this disclosure is fairly broad band in nature, and has a majority of its energy in the 10 KHz to 1 MHz range. Further, a typical underground distribution cable has a characteristic impedance of about 30 Ohms. A blocking impedance of 300 to 600 Ohm within the 10 KHz to 1 MHz is sufficient enough to effectively block a majority of the traveling wave. FIG. 9 illustrates the desired impedance characteristic of the blocking impedance.

The following are equations for the voltage and current reflection coefficients, with a calculation using the peak blocking impedance and the characteristic impedance of the cable. The cable impedance is actually a complex impedance that depends on the complex propagation velocity. The blocking impedance too is a complex impedance, having a characteristic as illustrated in FIG. 9.

$$Pv=(Zb-Zc)/(Zb+Zc)=-Pi$$

$$Pv=(600-30)/(600+30)=0.905 (90\% \text{ of the incident wave is reflected})$$

Pv—Voltage Reflection Coefficient
Pi—Current Reflection Coefficient
Zb—Load Impedance Presented by Installed Blocking Impedance
Zc—Cable Characteristic Impedance The above discussion has centered around a practical application of this invention based on interfacing with existing power distribution circuits and circuit components. Emphasis was placed on adding the blocking impedance to the neutral line only because of ease of access to this line at junction or branching points. A cables' center conductor or hot line is often terminated with an elbow or other similar commercial terminator, leaving limited access. Further, a hot line component must be designed for all conditions experienced by the cable circuit, including faulted conditions where current levels can reach many times that of normal operation. There are, for example, commercially available terminating impedance devices called reactors that can be tuned to match a desired frequency response. A reactor is large and expensive, but has the added benefit of arc suppression which limits the fault current. Use of reactors is typically limited to power substations.

Figure 10:
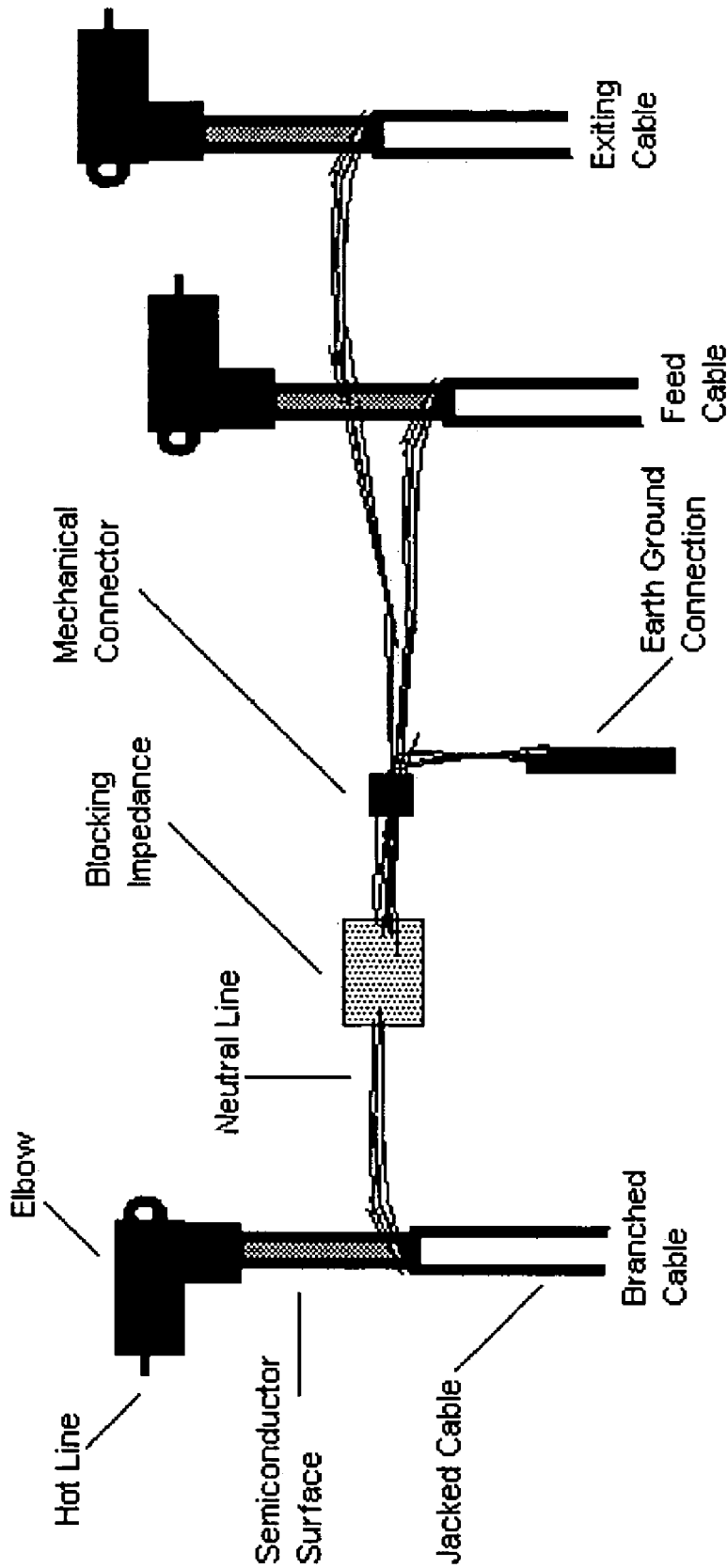
FIG. 10 is a schematic diagram illustrating a configuration of a blocking impedance according to the present invention.

The concentric neutral line is more readily accessible than the hot line. The neutral is often striped of insulation, mechanically connected to the neutral of the joining cables, and connected to earth ground. A blocking impedance can be readily installed in a neutral line prior to its connection to earth ground. FIG. 10 illustrates the physical connections using a coil or inductor on a branched cable. The elbows are connected together using standard bushings.

Much this discussion surrounds underground power distribution circuits. This method can also be effectively applied to overhead power distributions circuits to facilitate cable fault location estimation.

What is claimed:

1. A method for isolating a power line distribution comprising at least one branch power line having a power conductor, a neutral conductor to aid in fault detection, and at least one branching point where the branch power line is coupled to a main power line in the power line distribution, the method comprising the steps of:
   identifying the at least one branching point in the power line distribution;
   coupling an impedance device to at least one of the neutral conductor or the power conductor of the branch power line proximate to the at least one branching point to isolate the branch in the power line distribution; and
   coupling a fault recorder to the main power line to detect a fault in the main power line.

2. A method according to claim 1, wherein the step of coupling the impedance device to the at least one of the neutral conductor or the power conductor includes inserting an inductor in series with the at least one of the neutral conductor or the power conductor.

3. A method according to claim 2, wherein the step of inserting the inductor in series with the at least one of the neutral conductor or the power conductor includes the step of inserting the inductor in series with the neutral conductor proximate to a connection between the neutral conductor and a connection to earth ground.

4. A method according to claim 1, wherein the step of coupling the impedance device to the at least one of the neutral conductor or the power conductor includes coupling a ferrite element concentric with the at least one of the neutral conductor or the power conductor.

5. A method according to claim 4, wherein the step of coupling the ferrite element concentric with the at least one of the neutral conductor or the power conductor further includes the step of coupling a further ferrite element around the neutral conductor proximate to a connection between the neutral conductor and earth ground.

6. A method according to claim 1, wherein the power line distribution is an underground power line distribution and the step of coupling the impedance device to the at least one of the neutral conductor or the power conductor includes the step of coupling the impedance device to the at least one of the neutral conductor or the power conductor proximate to a connection between the power line distribution and an underground feed point.

7. A method according to claim 1, wherein the step of coupling the impedance device to the at least one of the neutral conductor or the power conductor includes the step of coupling a reactor in series with the power conductor.

8. A method according to claim 1, wherein the step of coupling the impedance device to the at least one of the neutral conductor or the power conductor includes the step of coupling the impedance device that exhibits relatively high impedance in the frequency range of 10 KHz to 1 MHz and exhibits relatively low impedance in a frequency range less than 100 Hz.

9. A power distribution system including a power conductor and a neutral conductor including a main section and at least one branch section that connects to the main section at at least one branching point, the power distribution system comprising:
   at least one impedance element coupled to the at least one branch section proximate to
   the at least one branching point, wherein the at least one impedance element includes at least one ferrite element concentric with the at least one of the neutral conductor or the power conductor;
   a plurality of fault distance indicators the fault distance indicators being coupled to the main section and to the at least one branch section, respectively.

10. A power distribution system according to claim 9, wherein the at least one impedance element includes at least one inductor connected in series with the at least one of the neutral conductor or the power conductor.

11. A power distribution system according to claim 10, wherein the at least one inductor includes a further inductor which is coupled to the neutral conductor proximate to a connection between the neutral conductor and earth ground.

12. A power distribution system according to claim 9, wherein the at least one ferrite element includes a further ferrite element which is coupled to the neutral connector proximate to a connection between the neutral conductor and earth ground.

* * * * *